(12) United States Patent
Kim et al.

(10) Patent No.: US 12,389,744 B2
(45) Date of Patent: Aug. 12, 2025

(54) ELECTROLUMINESCENT DEVICE, PRODUCTION METHOD THEREOF, AND DISPLAY DEVICE INCLUDING THE SAME

(71) Applicant: Samsung Electronics Co., Ltd., Suwon-si (KR)

(72) Inventors: Kwanghee Kim, Suwon-si (KR); Hong Kyu Seo, Suwon-si (KR); Heejae Lee, Suwon-si (KR); Eun Joo Jang, Suwon-si (KR); Hyo Sook Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 470 days.

(21) Appl. No.: 18/050,535

(22) Filed: Oct. 28, 2022

(65) Prior Publication Data
US 2023/0133351 A1    May 4, 2023

(30) Foreign Application Priority Data
Oct. 28, 2021 (KR) .................. 10-2021-0146036

(51) Int. Cl.
*H10K 50/16* (2023.01)
*B82Y 20/00* (2011.01)
(Continued)

(52) U.S. Cl.
CPC ............. *H10K 50/16* (2023.02); *C01G 9/006* (2013.01); *C09K 11/883* (2013.01); *H10K 71/00* (2023.02);
(Continued)

(58) Field of Classification Search
CPC ...... H10K 50/858; H10K 59/12; H10K 59/38; H10K 71/00; H10K 59/1201;
(Continued)

(56) References Cited

U.S. PATENT DOCUMENTS 6,803,128 B2    10/2004  Lee
9,118,033 B2    8/2015   Su et al.
(Continued)

FOREIGN PATENT DOCUMENTS

KR    100473283 B1    3/2005
KR    100579172 B1    5/2006
(Continued)

OTHER PUBLICATIONS

Eunjoo Jang et al., "White-Light-Emitting Diodes with Quantum Dot Color Converters for Display Backlights," Adv. Mater., May 31, 2010, pp. 3076-3080, vol. 22.
(Continued)

*Primary Examiner* — Caleb E Henry
(74) *Attorney, Agent, or Firm* — CANTOR COLBURN LLP (57) ABSTRACT

An electroluminescent device including an anode; a cathode; a light emitting layer disposed between the anode and the cathode; and an electron transport layer disposed between the light emitting layer and the cathode, wherein the light emitting layer includes a plurality of semiconductor nanoparticles, the electron transport layer includes zinc oxide nanoparticles including a Group IIA metal and an acid salt of an alkali metal that has an oxycarbonyl moiety, and the zinc oxide nanoparticles have an average size of less than or equal to about 20 nanometers (nm).

20 Claims, 1 Drawing Sheet (51) Int. Cl.
*B82Y 40/00* (2011.01)
*C01G 9/00* (2006.01)
*C09K 11/88* (2006.01)
*H10K 71/00* (2023.01)
*H10K 102/00* (2023.01)

(52) U.S. Cl.
CPC ............... *B82Y 20/00* (2013.01); *B82Y 40/00* (2013.01); *C01P 2004/64* (2013.01); *C01P 2006/40* (2013.01); *H10K 2102/331* (2023.02)

(58) Field of Classification Search
CPC ............ H10K 59/1213; H10K 59/123; H10K 59/1315; H10K 59/122; H10K 50/16; H10K 85/60; H10K 50/115; H10K 2102/00; H10K 2102/331; H10K 50/15; H10K 50/17; H10K 50/18; H10K 71/12; G02B 30/29; G02B 3/0006; G02F 1/133526; H05K 2201/10106; C09K 11/883; C09K 11/02; H01L 51/56; H01L 2251/5369; H01L 51/5096; H01L 51/5072; H01L 51/5088; H01L 51/5056; H01L 51/502; H01L 51/0003; H01L 2251/303; H01L 51/5004; H01L 51/5036; H01L 2251/558

See application file for complete search history.

(56) References Cited

U.S. PATENT DOCUMENTS

| | | | | |
|---|---|---|---|---|
| 9,559,327 | B2* | 1/2017 | Yoneda | H10K 59/873 |
| 9,564,609 | B2* | 2/2017 | Sasaki | H10K 50/818 |
| 9,577,206 | B2* | 2/2017 | Yamae | H10K 50/131 |
| 9,647,228 | B2* | 5/2017 | Seo | H10K 50/19 |
| 9,653,517 | B2* | 5/2017 | Uesaka | H10K 50/81 |
| 10,522,775 | B2* | 12/2019 | Tsukamoto | H05B 33/10 |
| 10,818,859 | B2 | 10/2020 | Park et al. | |
| 10,826,010 | B1* | 11/2020 | Montgomery | H10K 50/13 |
| 10,923,668 | B2 | 2/2021 | Park et al. | |
| 11,011,673 | B2 | 5/2021 | Park et al. | |
| 2002/0189542 | A1* | 12/2002 | Van Slyke | C23C 14/12 118/712 |
| 2003/0211651 | A1* | 11/2003 | Krasnov | C09K 11/883 438/102 |
| 2005/0098207 | A1* | 5/2005 | Matsumoto | H10K 50/155 313/506 |
| 2008/0199669 | A1* | 8/2008 | Lee | B82Y 20/00 428/407 |
| 2008/0264475 | A1* | 10/2008 | Ito | H10K 30/30 136/252 |
| 2009/0243473 | A1* | 10/2009 | Iwakuma | H10K 50/14 313/504 |
| 2010/0091353 | A1* | 4/2010 | Kokeguchi | C09K 9/02 359/268 |
| 2010/0237329 | A1* | 9/2010 | Jung | C09B 57/00 257/E51.027 |
| 2011/0155249 | A1* | 6/2011 | Tanabe | C07D 403/06 136/263 |
| 2011/0253218 | A1* | 10/2011 | Tanabe | C09B 23/0016 548/426 |
| 2012/0086331 | A1* | 4/2012 | Kobayashi | H10K 71/12 313/504 |
| 2014/0203246 | A1 | 7/2014 | Liu et al. | |
| 2014/0332786 | A1* | 11/2014 | Nakazawa | G09F 9/30 359/489.07 |
| 2015/0129861 | A1* | 5/2015 | Hamano | C07F 7/0812 252/500 |
| 2016/0150619 | A1* | 5/2016 | Krummacher | H10K 50/88 315/224 |
| 2016/0233449 | A1* | 8/2016 | Murayama | C09K 11/565 |
| 2017/0012231 | A1* | 1/2017 | Mishima | H10K 50/11 |
| 2018/0062101 | A1* | 3/2018 | Li | B05D 1/005 |
| 2018/0254421 | A1* | 9/2018 | Kinge | H10K 50/115 |
| 2020/0115387 | A1* | 4/2020 | Mitchell | H10K 85/656 |
| 2020/0266348 | A1* | 8/2020 | Kim | H10K 85/115 |
| 2020/0287148 | A1* | 9/2020 | Furukawa | H10K 71/15 |
| 2020/0321490 | A1* | 10/2020 | Yang | H10K 50/115 |
| 2020/0321546 | A1* | 10/2020 | He | H10K 50/11 |
| 2020/0328380 | A1* | 10/2020 | Benzie | H10K 71/12 |
| 2020/0343465 | A1* | 10/2020 | Ferrara | H10K 30/20 |
| 2020/0369824 | A1* | 11/2020 | Mitchell | H10K 85/113 |
| 2020/0388769 | A1* | 12/2020 | Pron | H10K 85/151 |
| 2020/0411719 | A1* | 12/2020 | Kimoto | H10K 50/165 |
| 2021/0070770 | A1* | 3/2021 | Mitchell | H10K 85/6572 |
| 2021/0104696 | A1* | 4/2021 | Park | H10K 85/1135 |
| 2021/0126218 | A1* | 4/2021 | Kim | H10K 85/60 |
| 2021/0249633 | A1* | 8/2021 | Fusella | H10H 20/84 |
| 2022/0216442 | A1* | 7/2022 | Kim | H10K 50/115 |

FOREIGN PATENT DOCUMENTS

| | | |
|---|---|---|
| KR | 20200011302 A | 2/2020 |
| KR | 20200021726 A | 3/2020 |
| KR | 20200039249 A | 4/2020 |
| KR | 20210092561 A | 7/2021 |

OTHER PUBLICATIONS

Md Arafat Mahmuda et al., "Cesium compounds as interface modifiers for stable and efficient perovskite solar cells," Solar Energy Materials and Solar Cells, Sep. 8, 2017, pp. 172-186, vol. 174.

Seth Coe et al., "Electroluminescence from single monolayers of nanocrystals in molecular organic devices," Nature, Dec. 2002, pp. 800-803, vol. 420.

Tae-Ho Kim et al., "Full-colour quantum dot displays fabricated by transfer printing," Nature Photonics, Mar. 2011, pp. 176-182, vol. 5.

* cited by examiner

ELECTROLUMINESCENT DEVICE, PRODUCTION METHOD THEREOF, AND DISPLAY DEVICE INCLUDING THE SAME

CROSS-REFERENCE TO RELATED APPLICATION

This application claims priority to and the benefit of Korean Patent Application No. 10-2021-0146036 filed in the Korean Intellectual Property Office on Oct. 28, 2021, and all the benefits accruing therefrom under 35 U.S.C. § 119, the entire content of which is incorporated herein by reference.

BACKGROUND

1. Field

The present disclosure relates to an electroluminescent device, a production method thereof, and a display device including the same.

2. Description of the Related Art

Semiconductor particles having a nanoscale size (e.g., semiconductor nanocrystal particles) may exhibit luminescence. For example, quantum dots including semiconductor nanocrystals may exhibit a quantum confinement effect. Light emission of semiconductor nanoparticles may be generated while, e.g., when, electrons in an excited state transition from a conduction band to a valence band by, for example, light excitation or voltage application. Semiconductor nanoparticles may be controlled to emit light in a desired wavelength region by controlling sizes thereof, compositions thereof, or a combination thereof. The nanoparticles may be used in a light emitting device (e.g., an electroluminescent device) and display devices including the same.

SUMMARY

An embodiment relates to a light emitting device that emits light by applying a voltage to a nanostructure (e.g., quantum dots).

An embodiment relates to a display device (e.g., a quantum dot (QD)-light emitting diode (LED) display) including semiconductor nanoparticles (e.g., quantum dots) as a light emitting material in one or more pixels.

In an embodiment, the electroluminescent device includes
an anode;
a cathode (for example, facing each other);
a light emitting layer disposed between the anode and the cathode; and
an electron auxiliary layer (e.g., an electron transport layer) disposed between the light emitting layer and the cathode,
wherein the light emitting layer includes a plurality of semiconductor nanoparticles,
the electron transport layer includes zinc oxide nanoparticles including a Group IIA metal (e.g., Group IIA metal containing zinc oxide nanoparticles) and an acid salt of alkali metal (e.g., potassium, rubidium, or cesium) that has an oxycarbonyl moiety (—COO— or —OCO—), and
the zinc oxide nanoparticles have an average size of less than or equal to about 20 nanometers (nm).

The acid salt of alkali metal may include a carboxylic acid group, a group derived therefrom (e.g., a carboxylate group), or a combination thereof.

The presence of the acid salt of alkali metal may be determined by the presence of the oxycarbonyl moiety (e.g., the carboxylic acid or the corresponding carboxylate) and the alkali metal.

The zinc oxide nanoparticles may have an average size of greater than or equal to about 2 nm and less than or equal to about 10 nm, greater than or equal to about 2.5 nm and less than or equal to about 7 nm, greater than or equal to about 3 nm and less than or equal to about 5 nm, or a combination thereof.

The electroluminescent device is configured to emit a first light (green light, blue light, or red light) when a voltage is applied. The first light may have a full width at half maximum (FWHM) of greater than or equal to about 5 nm and less than or equal to about 45 nm.

In an embodiment, the plurality of semiconductor nanoparticles may not include cadmium, lead, mercury, or a combination thereof.

The electroluminescent device may further include a hole auxiliary layer between the light emitting layer and the first electrode. The hole auxiliary layer may include a hole transport layer (including, for example, an organic compound), a hole injection layer, or a combination thereof.

The plurality of semiconductor nanoparticles may include a first semiconductor nanocrystal including zinc, selenium, and tellurium and a second semiconductor nanocrystal being different from the first semiconductor nanocrystal and including zinc chalcogenide.

The plurality of semiconductor nanoparticles may include a first semiconductor nanocrystal including indium, phosphorus, and optionally further include zinc and a second semiconductor nanocrystal being different from the first semiconductor nanocrystal and including zinc chalcogenide.

An average size of the plurality of semiconductor nanoparticles may be greater than or equal to about 7 nm, greater than or equal to about 8 nm, greater than or equal to about 9 nm, or greater than or equal to about 10 nm. The average size of the plurality of semiconductor nanoparticles may be less than or equal to about 30 nm, less than or equal to about 20 nm, less than or equal to about 15 nm, less than or equal to about 12 nm, or less than or equal to about 10 nm.

The plurality of semiconductor nanoparticles may include a core including the first semiconductor nanocrystal and a shell disposed on the core and including the second semiconductor nanocrystal.

The light emitting layer may have a zinc blend crystal structure.

The electron transport layer may be adjacent to the light emitting layer (e.g., disposed directly on the light emitting layer).

The Group IIA metal (i.e., an alkaline-earth metal) may include magnesium, calcium, beryllium, strontium, barium, or a combination thereof.

The zinc oxide nanoparticles, optionally, may further include zirconium (Zr), tungsten (W), lithium (Li), titanium (Ti), yttrium (Y), aluminum (Al), gallium (Ga), indium (In), tin (Sn), cobalt (Co), vanadium (V), or a combination thereof.

The zinc oxide nanoparticles may have an average size of greater than or equal to about 1 nm, for example, greater than or equal to about 3 nm.

The zinc oxide nanoparticles may have an average size of less than or equal to about 8 nm.

In the electron transport layer, a mole ratio of carbon to the Group IIA metal may be greater than or equal to about 4:1, or greater than or equal to about 4.1:1 and less than or equal to about 8:1.

In the electron transport layer, a mole ratio of oxygen to the Group IIA metal may be greater than or equal to about 13:1 or greater than or equal to about 13.5:1 and less than or equal to about 25:1.

In the electron transport layer, a mole ratio of alkali metal to zinc may be greater than or equal to about 0.08:1, greater than or equal to about 0.153:1 and less than or equal to about 0.5:1.

In the electron transport layer, a mole ratio of alkali metal to the Group IIA metal (e.g., magnesium) may be greater than or equal to about 0.8:1, greater than or equal to about 0.85:1, greater than or equal to about 0.87:1, greater than or equal to about 0.9:1 and less than or equal to about 2:1, or less than or equal to about 1.5:1, or less than or equal to about 1.2:1.

The acid salt of the alkali metal may include a compound represented by the chemical formula ACOOM, wherein A is hydrogen, a substituted or unsubstituted C1 to 10 hydrocarbon group, or a combination thereof, and M is sodium, potassium, rubidium, cesium, francium, or a combination thereof.

The acid salt of the alkali metal may include a formate, an acetate, a propionate, a butyrate, a valerate, a caproate, or a combination thereof.

The electron transport layer may have a first surface facing the light emitting layer and a second surface opposite the first surface.

In the electron transport layer, an amount of the alkali metal in a portion adjacent to the first surface of the electron transport layer may be greater than an amount of the alkali metal in a portion adjacent to the second surface of the electron transport layer.

The electron transport layer may include a first layer; and a second layer that is disposed on the first layer, wherein the first layer faces the light emitting layer, and an amount of the acid salt of the alkali metal in the first layer may be greater than an amount of the acid salt of the alkali metal in the second layer.

The second layer may include no or substantially no alkali metal.

An amount of the alkali metal in the first layer may be about 1.5 times or greater and about 100 times or less than an amount of the alkali metal in the second layer.

The electron transport layer may have a thickness of greater than or equal to about 5 nm and less than about 60 nm.

The electroluminescent device may have a maximum external quantum efficiency of greater than or equal to about 9%, greater than or equal to about 13%, or greater than or equal to about 15%.

The electroluminescent device may have a maximum luminance of greater than or equal to about 60,000 candelas per square meter ($cd/m^2$) greater than or equal to about 72,000 $cd/m^2$, or greater than or equal to about 75,000 $cd/m^2$.

In an embodiment, the method of producing the electroluminescent device, includes
  forming the light emitting layer on the first electrode;
  forming an electron transport layer on the light emitting layer; and
  forming a second electrode on the electron transport layer, wherein the forming of the electron transport layer includes
    dispersing the zinc oxide nanoparticles including the Group IIA metal; and the acid salt of the alkali metal in a first organic solvent to prepare a first mixture;
    applying the first mixture on the light emitting layer to form a film; and
    optionally heat-treating the film at a temperature of less than about 160° C., less than or equal to about 150° C., or less than or equal to about 120° C., for example, to produce the electroluminescent device.

The acid salt may include a formate, an acetate, a propionate, a butyrate, a valerate, a caproate, or a combination thereof.

The forming of the electron transport layer may further include
  dispersing Group IIA metal containing zinc oxide nanoparticles in a second organic solvent to prepare a second mixture; and
  applying the second mixture on the film and optionally thermally treating the film upon which the second mixture has been applied.

The method may include, after the formation of the second electrode, (optionally applying a polymerizable resin on the second electrode, and) maintaining (or aging) the device (e.g., without driving the device) up to about 160° C., for example at about 60° C. to about 100° C., for example, in air or in an inert gas or non-oxygen atmosphere. The aging time may be carried out for greater than or equal to about 24 hours, or greater than or equal to about 48 hours, and less than or equal to about 600 hours, less than or equal to about 500 hours, less than or equal to about 300 hours, less than or equal to about 200 hours, or less than or equal to about 180 hours. The aging may be carried out under inert gas or under atmosphere.

In an embodiment, the display device includes the electroluminescent device.

The display device may include a portable terminal device, a monitor, a notebook computer, a television, an electric sign board, a camera, or an electronic component.

According to an embodiment, an electroluminescent device capable of implementing improved electroluminescent properties and resin aging characteristics is provided. The electroluminescent device of an embodiment may exhibit life-span characteristics with a desired level of luminous efficiency.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Hereinafter, with reference to the accompanying drawings, various embodiments of the present disclosure will be described in detail so that those of ordinary skill in the art can easily carry out the present disclosure. The present disclosure may be embodied in many different forms and is not limited to the embodiments described herein.

In order to clearly explain the present disclosure, parts irrelevant to the description are omitted, and the same reference numerals are assigned to the same or similar elements throughout the specification.

The size and thickness of each constituent element as shown in the drawings are indicated for better understanding and ease of description, and this disclosure is not necessarily limited to sizes or thicknesses as shown. In the drawings, the thickness of layers, films, panels, regions, etc., are exaggerated for clarity. And in the drawings, for convenience of description, the thickness of some layers and regions are exaggerated.

In addition, it will be understood that when an element such as a layer, film, region, or substrate is referred to as being "on" another element, it can be directly on the other element or intervening elements may also be present. In contrast, when an element is referred to as being "directly on" another element, there are no intervening elements present. Also, to be disposed "on" the reference portion means to be disposed above or below the reference portion, and does not necessarily mean "above" in an opposite direction of gravity.

In addition, unless explicitly described to the contrary, the word "comprise" and variations such as "comprises" or "comprising" will be understood to imply the inclusion of stated elements but not the exclusion of any other elements.

Further, in the entire specification, the term "cross-sectional view" means a view in which a cross-section of the target part that is cut in a vertical direction is viewed from the side.

Further, the singular includes the plural unless mentioned otherwise. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "or" means "and/or." As used herein, the term "and/or" includes any and all combinations of one or more of the associated listed items.

In the drawings, the thickness of layers, films, panels, regions, etc., are exaggerated for clarity.

It will be understood that, although the terms "first," "second," "third," etc., may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

Unless otherwise defined, all terms (including technical and scientific terms) used herein have the same meaning as commonly understood by one of ordinary skill in the art to which this disclosure belongs. It will be further understood that terms, such as those defined in commonly used, e.g., non-technical, dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, values of a work function or (highest occupied molecular orbital (HOMO) or lowest unoccupied molecular orbital (LUMO)) energy levels are expressed as an absolute value from a vacuum level. In addition, a deep, a high, or large work function or energy level means that the absolute value is large when the vacuum level is set to "0 electronvolts (eV)," and a shallow, low, or small work function or energy level means that the absolute value is small when the vacuum level is set to "0 eV."

As used herein, the average (value) may be mean or median. In an embodiment, the average (value) may be a mean average.

As used herein, a number of carbon atoms in a group or a molecule may be referred to as a subscript (e.g., $C_{6\text{-}50}$) or as C6 to C50.

As used herein, when a definition is not otherwise provided, "substituted" refers to replacement of a, e.g., at least one, hydrogen of a compound or the corresponding moiety by a C1 to C30 alkyl group, a C1 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are each independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM', wherein M' is an organic or inorganic cation), a sulfonic acid group (—SO$_3$H) or a salt thereof (—SO$_3$M', wherein M' is an organic or inorganic cation), a phosphoric acid group (—PO$_3$H$_2$) or a salt thereof (—PO$_3$M'H or —PO$_3$M'$_2$, wherein M' is an organic or inorganic cation), or a combination thereof. The indicated number of carbon atoms in a group may be exclusive of any substituents, e.g., a cyanoethyl group is a C2 hydrocarbon group substituted with a cyano group.

As used herein, when a definition is not otherwise provided, a "hydrocarbon" or "hydrocarbon group" refers to a compound or a group containing carbon and hydrogen (e.g., an aliphatic group such as an alkyl, alkenyl, or alkynyl group, or an aromatic group such as an aryl group). The hydrocarbon group may be a monovalent group or a group having a valence of greater than one formed by removal of one or more hydrogen atoms from alkane, alkene, alkyne, or arene. In the hydrocarbon group of an embodiment, a, e.g., at least one, methylene may be replaced by an oxide moiety, a carbonyl moiety, an ester moiety, —NH—, or a combination thereof. Unless otherwise stated to the contrary, the hydrocarbon (alkyl, alkenyl, alkynyl, or aryl) group may have 1 to 60, 2 to 32, 3 to 24, or 4 to 12 carbon atoms. In an embodiment, a hydrocarbon group may not be substituted with a carboxylic acid or carboxylate group.

As used herein, when a definition is not otherwise provided, "alkyl" refers to a linear or branched saturated monovalent hydrocarbon group (methyl, ethyl hexyl, etc.). Unless specified otherwise, an alkyl group has from 1 to 50 carbon atoms, or 1 to 18 carbon atoms, or 1 to 12 carbon atoms.

As used herein, when a definition is not otherwise provided, "alkenyl" refers to a linear or branched monovalent hydrocarbon group having one or more carbon-carbon double bond. In an embodiment, an alkenyl group may have from 2 to 50 carbon atoms, or 2 to 18 carbon atoms, or 2 to 12 carbon atoms.

As used herein, when a definition is not otherwise provided, "alkynyl" refers to a linear or branched monovalent hydrocarbon group having one or more carbon-carbon triple bond. In an embodiment, an alkenyl group may have from 2 to 50 carbon atoms, or 2 to 18 carbon atoms, or 2 to 12 carbon atoms.

As used herein, when a definition is not otherwise provided, "aryl" refers to a group formed by removal of a, e.g., at least one, hydrogen from an aromatic group (e.g., a phenyl or naphthyl group). In an embodiment, an aryl group may have from 6 to 50 carbon atoms, or 6 to 18 carbon atoms, or 6 to 12 carbon atoms.

As used herein, when a definition is not otherwise provided, "hetero" refers to one including 1 to 3 heteroatoms of N, O, S, Si, P, or a combination thereof.

As used herein, when a definition is not otherwise provided, "alkoxy" means an alkyl group linked via an oxygen (i.e., alkyl-O—), such as a methoxy, ethoxy, or sec-butyloxy group.

As used herein, when a definition is not otherwise provided, "amine" or "amine group" may be represented by —NRR, wherein each R is independently hydrogen, a C1 to C12 alkyl group, a C7 to C20 alkylarylene group, a C7 to C20 arylalkylene group, or a C6 to C18 aryl group.

In an embodiment, "alkylene group" may be a straight or branched saturated aliphatic hydrocarbon group having at least two valences and optionally substituted with a, e.g., at least one, substituent.

In an embodiment, "arylene group" may be a functional group having at least two valences obtained by removal of at least two hydrogens in an, e.g., at least one, aromatic ring, and optionally substituted with a, e.g., at least one, substituent.

In an embodiment, "aliphatic group" or "aliphatic hydrocarbon" may be a saturated or unsaturated linear or branched C1 to C30 group consisting of carbon and hydrogen.

In an embodiment, "aromatic" or "aromatic organic group" may include a C6 to C30 aryl group or a C2 to C30 heteroaryl group, and "alicyclic group" refers to a saturated or unsaturated C3 to C30 cyclic group consisting of carbon and hydrogen.

As used herein, when a definition is not otherwise provided, "(meth)acrylate" refers to acrylate, methacrylate, or a combination thereof. The (meth)acrylate may include a (C1 to C10 alkyl)acrylate, a (C1 to C10 alkyl)methacrylate, or a combination thereof.

As used herein, "poly(meth)acrylic refers to a polyacrylic, a polymethacrylic, or a combination thereof.

As used herein, the term "chalcogenide" is inclusive of sulfur (S), selenium (Se), and tellurium (Te). In an embodiment, the term "chalcogenide" may include or may not include oxygen (O).

As used herein, the acid salt refers to a salt derived from an acid having a —COOH group, and thus may have a —COO⁻ group. The acid salt may exhibit acidity when dissolved in a solvent. In an embodiment, the carboxylic acid salt contains only one carboxylic acid groups. In an embodiment, the acid salt may be or may include a carboxylic acid salt.

As used herein, a description of not containing harmful heavy metals such as cadmium may refer to a concentration of cadmium (or a corresponding heavy metal) of less than or equal to about 100 parts per million by weight (ppmw), less than or equal to about 50 ppmw, less than or equal to about 10 ppmw, or about zero ppmw. In an embodiment, substantially no cadmium (or other heavy metal) is present, or, if present, in an amount or impurity level below the detection limit of a given detection means.

In an embodiment, numerical ranges stated herein are inclusive of the endpoint of each range.

As used herein, the upper and lower endpoints set forth for various numerical values may be independently combined to provide a range.

Unless otherwise stated, the words "substantially" or "about" are omitted before values in the numerical ranges specified herein.

As used herein, "substantially" or "about" means not only the stated value, but also the mean within an acceptable range of deviations, considering the errors associated with the corresponding measurement and the measurement of the measured value. For example, "substantially" can mean within ±10%, 5%, 3%, or 1% or within standard deviation of the stated value.

Herein, a nanostructure or a nanoparticle is a structure having a, e.g., at least one, region or characteristic dimension with a dimension of less than or equal to about 500 nm. In an embodiment, the dimension of the nanoparticle may be less than about 300 nm, less than about 250 nm, less than about 150 nm, less than about 100 nm, less than about 50 nm, or less than about 30 nm. The structures may have any suitable shape. Unless otherwise specified herein, the nanoparticles or semiconductor nanoparticles may have any suitable shape, such as nanowires, nanorods, nanotubes, multi-pod type shapes having two or more pods, nanodots (or quantum dots), etc., and are not particularly limited. The nanoparticles may be, for example, substantially crystalline, substantially monocrystalline, polycrystalline, amorphous, or a combination thereof.

For example, semiconductor nanoparticles such as quantum dots may exhibit quantum confinement or exciton confinement. In the present specification, the term "nanoparticles or quantum dots" are not limited in shapes thereof unless specifically defined. Semiconductor nanoparticles, such as quantum dots, may have a size smaller than a diameter of Bohr excitation in the bulk crystal of the same material, and may exhibit a quantum confinement effect. Quantum dots may emit light corresponding to a bandgap energy thereof by controlling the size of the emission center of the nanocrystals.

Herein, T50 refers to a time for luminance of a given device to decrease to 50% of the initial luminance when the device is driven at predetermined luminance.

Herein, T90 refers to a time for luminance of a given device to decrease to 90% of the initial luminance when the device is driven at predetermined luminance.

Herein, external quantum efficiency (EQE) refers to a ratio of the number of photons emitted from a light emitting diode (LED) to the number of electrons passing through the device. EQE may be a criteria of how efficiently the light emitting diode converts the electrons into the photons and allows them to escape. In an embodiment, EQE may be determined based on the following equation:

EQE=(Injection efficiency)×(Solid state quantum yield)×(Extraction efficiency)

Injection efficiency=proportion of electrons passing through the device that are injected into the active region;

Solid state quantum yield=proportion of all electron-hole recombinations in the active region that are radiative and produce photons; and Extraction efficiency=proportion of photons generated in the active region that escape from the device.

Herein, the maximum external quantum efficiency refers to the maximum value of the external quantum efficiency.

Herein, the maximum luminance refers to a maximum value of luminance that the device can achieve.

Herein, quantum efficiency is a term used interchangeably with quantum yield. Quantum efficiency (or quantum yield) may be measured either in solution or in the solid state (in a composite). In an embodiment, quantum efficiency (or quantum yield) is the ratio of photons emitted to photons absorbed by the nanostructure or population thereof. In an embodiment, quantum efficiency may be measured by any suitable method. For example, for fluorescence quantum yield or efficiency, there may be two methods: an absolute method and a relative method.

In the absolute method, quantum efficiency is obtained by detecting the fluorescence of all samples through an integrating sphere. In the relative method, the quantum efficiency of the unknown sample is calculated by comparing the fluorescence intensity of a standard dye (standard sample) with the fluorescence intensity of the unknown sample. Coumarin 153, Coumarin 545, Rhodamine 101 inner salt, Anthracene and Rhodamine 6G may be used as standard dyes according to photoluminescence (PL) wavelengths thereof, but the present disclosure is not limited thereto.

Bandgap energies of semiconductor nanocrystal particles may be changed according to sizes, structures, and compositions of nanocrystals. For example, as the sizes of the semiconductor nanocrystals increase, the bandgap energies of the semiconductor nanocrystals may narrow, e.g., decrease, and emission wavelengths of the semiconductor nanocrystals may increase.

Semiconductor nanocrystals may be used as light emitting materials in various fields of a display device, an energy device, or a bio light emitting device, for example.

A semiconductor nanocrystal particle-based light emitting device (hereinafter, also referred to as a QD-LED) that emits light by application of a voltage includes semiconductor nanocrystal particles as a light emitting material. A QD-LED adopts a different emission principle from that of an organic light emitting diode (OLED) emitting light by using an organic material as an emission center, may realize, e.g., exhibit, purer colors (for example, red, green, and/or blue) and improved color reproducibility, and accordingly, may be used as a next generation display device. A QD-LED may be produced with a reduced cost by including a solution process, may be based on an inorganic material, and may be expected to realize e.g., exhibit, increased stability, but technology development for improving device properties and life-span characteristics is desired.

In addition, quantum dots having electroluminescent properties at a practically applicable, e.g., desirable, level may contain harmful heavy metals such as cadmium (Cd), lead, mercury, or a combination thereof. Accordingly, it is desirable to provide a light emitting device or a display device having a light emitting layer substantially free of the harmful heavy metal.

An electroluminescent device according to an embodiment is a photoluminescent type light emitting device configured to emit a desired light by applying a voltage without a separate light source In an embodiment, the electroluminescent device includes an anode 1 and a cathode 5 spaced apart (e.g., opposite to each other); a light emitting layer 3 disposed between the anode and the cathode and including a plurality of semiconductor nanoparticles; and an electron transport layer (4) between the light emitting layer 3 and the cathode 5. The electroluminescent device may further include a hole auxiliary layer 2 between the light emitting layer and the anode. The hole auxiliary layer may include a hole transport layer (including, for example, an organic compound), a hole injection layer, or a combination thereof. (Refer to FIG. 1)

In the electroluminescent device, the anode 10 or the cathode 20 may be disposed on a (transparent) substrate 100. The transparent substrate may be a light extraction surface. (Refer to FIGS. 2 and 3) Referring to FIGS. 2 and 3, the light emitting layer 30 may be disposed between the anode 10 and the cathode 50. The cathode 50 may include an electron injection conductor. The anode 10 may include a hole injection conductor. The work functions of the electron/hole injection conductors included in the cathode and the anode may be appropriately adjusted and are not particularly limited. For example, the cathode may have a small work function and the anode may have a relatively large work function, or vice versa.

Figure 2:
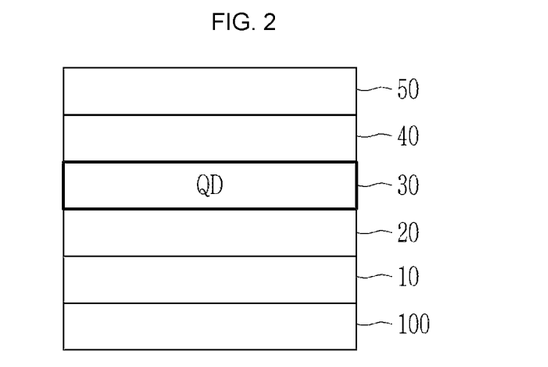
FIG. 2 is a schematic cross-sectional view of an electroluminescent device according to an embodiment.
Figure 3:
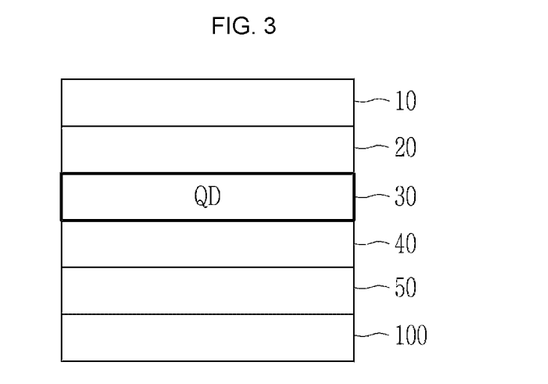
FIG. 3 is a schematic cross-sectional view of an electroluminescent device according to an embodiment.

The electron/hole injection conductors may include a metal-based material (e.g., a metal, a metal compound, an alloy, or a combination thereof) (aluminum, magnesium, tungsten, nickel, cobalt, platinum, palladium, calcium, LiF, etc.), a metal oxide such as gallium indium oxide or indium tin oxide (ITO), or a conductive polymer (e.g., having a relatively high work function) such as polyethylene dioxythiophene, but are not limited thereto.

The anode, the cathode, or a combination thereof may be a light-transmitting electrode or a transparent electrode. In an embodiment, both the anode and the cathode may be a light-transmitting electrode. The electrode may be patterned. The anode, the cathode, or a combination thereof may be disposed on a (e.g., insulating) substrate 100. The substrate 100 may be optically transparent (e.g., may have a light transmittance of greater than or equal to about 50%, greater than or equal to about 60%, greater than or equal to about 70%, greater than or equal to about 80%, greater than or equal to about 85%, or greater than or equal to about 90% and for example, less than or equal to about 99%, or less than or equal to about 95%). The substrate may further include a region for a blue pixel, a region for a red pixel, a region for a green pixel, or a combination thereof. A thin film transistor may be disposed in each region of the substrate, and one of a source electrode and a drain electrode of the thin film transistor may be electrically connected to the anode or the cathode.

The light-transmitting electrode may be disposed on a (e.g., insulating) transparent substrate. The substrate may be rigid or flexible. The substrate may be plastic, glass, or a metal.

The light-transmitting electrode may be made of, for example, a transparent conductor such as indium tin oxide (ITO) or indium zinc oxide (IZO), gallium indium tin oxide, zinc indium tin oxide, titanium nitride, polyaniline, LiF/Mg: Ag, or the like, or a thin metal thin film of a single layer or a plurality of layers, but is not limited thereto. When one of the anode and the cathode is an opaque electrode, the opaque electrode may be made of an opaque conductor such as aluminum (Al), a lithium-aluminum (Li:Al) alloy, a magnesium-silver alloy (Mg;Ag), and lithium fluoride-aluminum (LiF:Al).

The thickness of each electrode (e.g., the anode, the cathode, or each of the anode and the cathode) is not particularly limited and may be appropriately selected taking into consideration device efficiency. For example, the thickness of the electrode may be greater than or equal to about 5 nm, greater than or equal to about 10 nm, greater than or equal to about 20 nm, greater than or equal to about 30 nm, greater than or equal to about 40 nm, or greater than or equal to about 50 nm. For example, the thickness of the electrode may be less than or equal to about 100 micrometers (μm), less than or equal to about 90 μm, less than or equal to about 80 μm, less than or equal to about 70 μm, less than or equal to about 60 μm, less than or equal to about 50 μm, less than or equal to about 40 μm, less than or equal to about 30 μm, less than or equal to about 20 μm, less than or equal to about 10 μm, less than or equal to about 1 μm, less than or equal to about 900 nm, less than or equal to about 500 nm, or less than or equal to about 100 nm.

Figure 1:
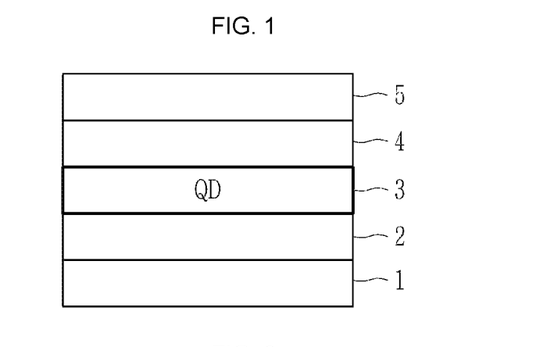
FIG. 1 is a schematic cross-sectional view of an electroluminescent device according to an embodiment.

A light emitting layer 3 or 30 is disposed between the anode 1 and the cathode 5 (e.g., the anode 10 and the cathode 50. The light emitting layer includes semiconductor nanoparticle (e.g., blue light emitting nanoparticles, red light emitting nanoparticles, or green light emitting nanoparticles). The light emitting layer may include one or more (e.g., 2 or more or 3 or more and 10 or less) monolayers of a plurality of nanoparticles.

The light emitting layer may be patterned. In an embodiment, the patterned light emitting layer may include a blue light emitting layer (e.g., disposed within a blue pixel in a display device to be described herein), a red light emitting layer (e.g., disposed within a red pixel in a display device to be described herein), and a green light emitting layer (e.g., disposed within a green pixel in a display device to be described herein)), or a combination thereof. Each of the light emitting layers may be (e.g., optically) separated from an adjacent light emitting layer by a partition wall. In an embodiment, a partition wall such as a black matrix may be disposed between the red light emitting layer, the green light emitting layer, and the blue light emitting layer. In an embodiment, the red light emitting layer, the green light emitting layer, and the blue light emitting layer may each be optically isolated.

In the light emitting layer of an embodiment, the semiconductor nanoparticles may exhibit a zinc blend crystal structure. In an embodiment, the semiconductor nanoparticles may not exhibit a perovskite crystal structure.

The light emitting layer or semiconductor nanoparticle may not contain cadmium. The light emitting layer or semiconductor nanoparticle may not contain mercury, lead, or a combination thereof.

In an embodiment, the semiconductor nanoparticles may have a core-shell structure. The semiconductor nanoparticles may include a core including a first semiconductor nanocrystal and a shell including a second semiconductor nanocrystal disposed on the core and having a composition different from that of the first semiconductor nanocrystal.

The semiconductor nanoparticle (e.g., the first semiconductor nanocrystal, the second semiconductor nanocrystal, or a combination thereof) may include a Group II-VI compound, a Group III-V compound, a Group IV-VI compound, a Group IV element or compound, a Group compound, a Group I-II-IV-VI compound, or a combination thereof. The light emitting layer (or semiconductor nanoparticle, first semiconductor nanocrystal, or second semiconductor nanocrystal) may not contain harmful heavy metals such as cadmium, lead, mercury, or a combination thereof.

The Group II-VI compound may be a binary compound such as ZnS, ZnSe, ZnTe, ZnO, HgS, HgSe, HgTe, MgSe, MgS, or a combination thereof; a ternary compound such as ZnSeS, ZnSeTe, ZnSTe, HgSeS, HgSeTe, HgSTe, HgZnS, HgZnSe, HgZnTe, MgZnSe, MgZnS, or a combination thereof; a quaternary compound such as HgZnTeS, HgZnSeS, HgZnSeTe, HgZnSTe, or a combination thereof; or a combination thereof. The Group II-VI compound may further include a Group III metal.

The Group III-V compound may be a binary compound such as GaN, GaP, GaAs, GaSb, AlN, AlP, AlAs, AlSb, InN, InP, InAs, InSb, or a combination thereof; a ternary compound such as GaNP, GaNAs, GaNSb, GaPAs, GaPSb, AlNP, AlNAs, AlNSb, AlPAs, AlPSb, InNP, InNAs, InNSb, InPAs, InPSb, or a combination thereof; a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof; or a combination thereof. The Group III-V compound may further include a Group II element. An example of such a semiconductor nanocrystal is InZnP.

The Group IV-VI compound may be a binary compound such as SnS, SnSe, SnTe, or a combination thereof; a ternary compound such as SnSeS, SnSeTe, SnSTe, or a combination thereof; a quaternary compound such as SnSSeTe; or a combination thereof.

Examples of the Group compound include $CuInSe_2$, $CuInS_2$, CuInGaSe, and CuInGaS, but are not limited thereto.

Examples of the group I-II-IV-VI compound include, but are not limited to, CuZnSnSe and CuZnSnS.

The Group IV element or compound is a single element compound such as Si, Ge, or a combination thereof; a binary compound such as SiC, SiGe, or a combination thereof; or a combination thereof.

In an embodiment, the first semiconductor nanocrystal may include a metal including indium, zinc, or a combination thereof and a non-metal including phosphorus, selenium, tellurium, sulfur, or a combination thereof. In an embodiment, the second semiconductor nanocrystal may include a metal including indium, zinc, or a combination thereof, and a non-metal including phosphorus, selenium, tellurium, sulfur, or a combination thereof.

In an embodiment, the first semiconductor nanocrystal may include InP, InZnP, ZnSe, ZnSeS, ZnSeTe, or a combination thereof; the second semiconductor nanocrystal may include ZnSe, ZnSeS, ZnS, ZnTeSe, or a combination thereof; or a combination thereof. In an embodiment, the shell may include zinc, sulfur, and optionally further include selenium in the outermost layer.

In an embodiment, the semiconductor nanoparticles may emit blue or green light and have a core including ZnSeTe, ZnSe, or a combination thereof and a shell including zinc chalcogenide (e.g., ZnS, ZnSe, ZnSeS, or a combination hereof). An amount of sulfur in the shell may increase or decrease in the radial direction (in a direction from the core toward the surface).

In an embodiment, the semiconductor nanoparticles may emit red or green light, the core may include InP, InZnP, or a combination thereof, and the shell may include a Group II metal including zinc and a non-metal including sulfur, selenium, or a combination thereof.

In an embodiment, when the semiconductor nanoparticles have a core-shell structure, an alloyed layer may or may not be present at the interface between the core and the shell. The alloyed layer may be a homogeneous alloy or may be a gradient alloy. In the gradient alloy, a concentration of elements present in the shell may have a concentration gradient that changes in the radial direction (e.g., decreases or increases in a direction toward the center).

In an embodiment, the shell may have a composition which is changed in a radial direction. In an embodiment, the shell may be a multilayered shell including two or more layers. In the multilayered shell, adjacent two layers may have different compositions from each other. In the multi-layered shell, a, e.g., at least one, layer may independently include a semiconductor nanocrystal having a single composition. In the multilayered shell, a, e.g., at least one, layer may independently have an alloyed semiconductor nanocrystal. In the multilayered shell, a, e.g., at least one layer, may have a concentration gradient that radially changes in terms of a composition of a semiconductor nanocrystal.

In the core-shell structured semiconductor nanoparticles, the bandgap energy of the shell material may be greater than that of the core material, but is not limited thereto. The bandgap energy of the shell material may be smaller than that of the core material. In the case of the multilayered shell, the bandgap energy of the outermost layer material of the shell may be greater than those of the core and the inner layer material of the shell (layers that are closer to the core). In the case of the multilayered shell, a semiconductor nanocrystal of each layer is selected to have an appropriate bandgap, thereby effectively showing, e.g., exhibiting, a quantum confinement effect.

The semiconductor nanoparticles of an embodiment may include, for example, an organic ligand, an organic solvent, or a combination thereof, in a state in which they are bonded or coordinated to the surface.

In an embodiment, an absorption/emission wavelength of the semiconductor nanoparticle may be controlled by, for example, adjusting a composition thereof, a size thereof, or a combination thereof. The semiconductor nanoparticles included in the light emitting layer 3 or 30 may be configured to emit light of a desired color. The semiconductor nanoparticles may include blue light emitting semiconductor nanoparticles, green light emitting semiconductor nanoparticles, or red light emitting semiconductor nanoparticles.

A maximum emission peak wavelength of the semiconductor nanoparticle may have a wavelength range of ultraviolet to infrared wavelengths or more. For example, the maximum light emitting peak wavelength of the semiconductor nanoparticle may be greater than or equal to about 300 nm, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum light emitting wavelength of the semiconductor nanoparticle may be in the range of less than or equal to about 800 nm, for example, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum light emitting wavelength of the semiconductor nanoparticle may be in the range of about 500 nm to about 650 nm.

The semiconductor nanoparticles or the light emitting layer may emit green light, and the maximum emission wavelength may be in the range of greater than or equal to about 500 nm (e.g., greater than or equal to about 510 nm) and less than or equal to about 560 nm (e.g., less than or equal to about 540 nm). The semiconductor nanoparticle or the light emitting layer may emit red light, and the maximum emission wavelength may be in the range of greater than or equal to about 600 nm (e.g., greater than or equal to about 610 nm) and less than or equal to about 650 nm (e.g., less than or equal to about 640 nm). The semiconductor nanoparticle or the light emitting layer may emit blue light, and the maximum emission wavelength may be greater than or equal to about 440 nm (e.g., greater than or equal to about 450 nm) and less than or equal to about 480 nm (e.g., less than or equal to about 465 nm).

The semiconductor nanoparticle or the light emitting layer may exhibit a photoluminescence spectrum having a relatively narrow full width at half maximum. In an embodiment, the semiconductor nanoparticle or the light emitting layer may have a full width at half maximum of less than or equal to about 45 nm, for example less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, or less than or equal to about 35 nm, in a photoluminescence spectrum thereof.

The semiconductor nanoparticle or light emitting layer may have (e.g., be configured to implement) a quantum yield of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 80%, greater than or equal to about 90%, or about 100%.

The semiconductor nanoparticle may have a size (e.g., a particle diameter or a particle diameter calculated from a two-dimensional area confirmed by electron microscopy analysis in the case of non-spherical particles) of greater than or equal to about 1 nm and less than or equal to about 100 nm. In an embodiment, the semiconductor nanoparticle may have a size of about 1 nm to about 50 nm, for example, 2 nm (or 3 nm) to 35 nm. In an embodiment, the size of the semiconductor nanoparticle may be greater than or equal to about 1 nm, greater than or equal to about 2 nm, greater than or equal to about 3 nm, greater than or equal to about 4 nm, or greater than or equal to about 5 nm. In an embodiment, the size of the semiconductor nanoparticle may be less than or equal to about 50 nm, less than or equal to about 40 nm, less than or equal to about 30 nm, less than or equal to about 25 nm, less than or equal to about 20 nm, less than or equal to about 19 nm, less than or equal to about 18 nm, less than or equal to about 17 nm, less than or equal to about 16 nm, or less than or equal to about 15 nm.

The semiconductor nanoparticle may have any suitable shape. In an embodiment, the shape of the semiconductor nanoparticle may be a sphere, a polyhedron, a pyramid, a multi-pod, a cube, a nanotube, a nanowire, a nanofiber, a nanosheet, a nanoplate, or a combination thereof.

The semiconductor nanoparticle may be synthesized by any suitable method. For example, the semiconductor nanocrystal having a size of several nanometers may be synthesized through a wet chemical process. In the chemical wet method, crystal particles are grown by reacting precursor materials in an organic solvent, and growth of crystals may be controlled by coordinating the organic solvent or ligand compound on the surface of the semiconductor nanocrystals.

In an embodiment, for example, the method of preparing the semiconductor nanoparticles having a core-shell structure may include: obtaining a core; preparing a first shell precursor containing a metal (e.g., zinc) and a first shell precursor solution containing an organic ligand; preparing a second shell precursor containing a non-metal element (e.g., sulfur, selenium, or a combination thereof); and heating the first shell precursor solution to a reaction temperature (e.g., greater than or equal to about 180° C., greater than or equal to about 200° C., greater than or equal to about 240° C., or greater than or equal to about 280° C. to less than or equal to about 360° C., less than or equal to about 340° C., or less than or equal to about 320° C.) and adding the core and the second shell precursor to form a shell of a second semiconductor nanocrystal on the first semiconductor nanocrystal core. In the semiconductor nanoparticles of embodiment, the core may be manufactured by an appropriate method. The method may further include preparing a core solution by separating the core from the reaction system used for a preparation thereof and dispersing the core in an organic solvent.

In an embodiment, for shell formation, a solvent and optionally a ligand compound may be heated (or vacuum-treated) under vacuum to a predetermined temperature (e.g., 100° C. or higher), and may be heated to a predetermined temperature (e.g., 100° C. or higher) after converting a reaction atmosphere for the shell formation to an inert gas atmosphere. Subsequently, the core is added thereto, and the shell precursors are sequentially or simultaneously added thereto and then, heated at a predetermined reaction temperature to perform a reaction. The shell precursors may be sequentially introduced in different proportions of the mixture during the reaction time.

The organic solvent may include a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctylamine) substituted with a, e.g., at least one (e.g., 1, 2, or 3), C6 to C22 alkyl group, a phosphine oxide (e.g., trioctylphosphine oxide) substituted with a (e.g., 1, 2, or 3) C6 to C22 alkyl group, a C12 to C22 aromatic ether such as phenyl ether or benzyl ether, or a combination thereof. A combination including more than one type of organic solvent may be used.

The organic ligand may coordinate the surfaces of the prepared semiconductor nanoparticles, and allow the semiconductor nanoparticles to be well dispersed in the solution. The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, $R_2POOH$, (wherein R and R' are each independently a substituted or unsubstituted C1 or greater, C6 or greater, or 010 or greater and C40 or less, C35 or less, or C25 or less aliphatic hydrocarbon, or a substituted or unsubstituted C6 to C40 aromatic hydrocarbon, or a combination thereof), or a combination thereof. In an embodiment, at least two different ligands may be used.

The semiconductor nanocrystals may be recovered by pouring into an excess of nonsolvent to remove excess organic matter not coordinated on the surface, and centrifuging the resulting mixture. The nonsolvent may be a polar solvent that is miscible with the solvent used in the core formation reaction, shell formation reaction, or a combination thereof and is not capable of dispersing the prepared nanocrystals. The nonsolvent may be selected depending on, e.g., taking into consideration, the solvent used in the reaction and may include, for example, acetone, ethanol, butanol, isopropanol, ethanediol, water, tetrahydrofuran (THF), dimethylsulfoxide (DMSO), diethylether, formaldehyde, acetaldehyde, ethylene glycol, a solvent having a similar solubility parameter to the foregoing solvents, or a combination thereof. The semiconductor nanocrystal particles may be separated through centrifugation, sedimentation, chromatography, or distillation. The separated nanocrystals may be added to a washing solvent and washed, if desired. The washing solvent has no particular limit and may have a similar solubility parameter to that of the ligand and may, for example, include hexane, heptane, octane, chloroform, toluene, or benzene.

The semiconductor nanoparticles may be non-dispersible or water-insoluble in water, the aforementioned nonsolvent, or a combination thereof. The semiconductor nanoparticles may be dispersed in the aforementioned organic solvent. In an embodiment, the aforementioned semiconductor nanoparticles may be dispersed in a substituted or unsubstituted C6 to C40 aliphatic hydrocarbon, a substituted or unsubstituted C6 to C40 aromatic hydrocarbon, or a combination thereof.

The surface of the prepared semiconductor nanoparticles may be treated with a halogen compound. By halogen treatment, some organic ligands present in the semiconductor nanoparticles may be replaced with halogen. The halogen-treated semiconductor nanoparticles may contain a reduced amount of organic ligand. The halogen treatment may be performed by contacting semiconductor nanoparticles with a halogen compound (e.g., a metal halide such as zinc chloride) at a predetermined temperature, for example, about 30° C. to about 100° C., or about 50° C. to about 150° C. in an organic solvent. The halogen-treated semiconductor nanoparticles may be separated using the aforementioned nonsolvent.

In the display device or light emitting device, a thickness of the light emitting layer may be appropriately selected. In an embodiment, the light emitting layer may include a monolayer of semiconductor nanoparticles. In an embodiment, the light emitting layer may include one or more, for example, two or more, three or more, or four or more and 20 or less, 10 or less, 9 or less, 8 or less, 7 or less, or 6 or less monolayers of semiconductor nanoparticles. The light emitting layer may have a thickness of greater than or equal to about 5 nm, for example, greater than or equal to about 10 nm, greater than or equal to about 15 nm, greater than or equal to about 20 nm, greater than or equal to about 25 nm, or greater than or equal to about 30 nm and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The light emitting layer may have a thickness of, for example about 10 nm to about 150 nm, about 20 nm to about 100 nm, or about 30 nm to about 50 nm.

The light emitting layer may have a single layer or a multilayer structure in which two or more layers are stacked. Adjacent layers in the multilayer structure (e.g., a first light emitting layer and a second light emitting layer) may be configured to emit the same color. In a multilayer structure, adjacent layers (e.g., a first light emitting layer and a second light emitting layer) may have the same or different compositions, ligands, or a combination thereof from each other. In an embodiment, the light emitting layer or the multilayer light emitting layer including two or more layers may have a halogen amount that changes in a thickness direction. In the (multilayer) light emitting layer according to an embodiment, the halogen amount may increase in a direction toward the electron auxiliary layer. In the (multilayer) light emitting layer according to an embodiment, the organic ligand amount may decrease in a direction toward the electron auxiliary layer. In the light emitting layer according to an embodiment, the halogen amount may decrease in a direction toward the electron auxiliary layer. In the (multilayer) light emitting layer according to an embodiment, the organic ligand amount may increase in a direction toward the electron auxiliary layer.

In an embodiment, the forming of the light emitting layer 13 including semiconductor nanoparticles may be carried out by obtaining a coating liquid including semiconductor nanoparticles and an organic solvent (e.g., an alkane solvent such as octane and heptane, an aromatic solvent such as toluene, or a combination thereof), and applying or depositing the coating liquid on a substrate or charge auxiliary layer (e.g., hole auxiliary layer) in an appropriate manner (e.g., by spin coating, inkjet printing, etc.). The type of the organic solvent for the semiconductor nanoparticle dispersion is not particularly limited and may be appropriately selected. In an embodiment, the organic solvent may include an (substituted or unsubstituted) aliphatic hydrocarbon organic solvent, an (substituted or unsubstituted) aromatic hydrocarbon organic solvent, an acetate solvent, or a combination thereof.

In the electroluminescent device of an embodiment, an electron transport layer based on the group IIA metal—containing zinc oxide nanoparticles is provided on the light emitting layer. Without wishing to be bound by any theory, it is believed that the presence of the Group IIA metal in the zinc oxide nanoparticle in the ETL may contribute to suppression of exciton quenching and improvement of electron transport properties in the light emitting layer based on semiconductor nanocrystals by reducing oxygen vacancy or defects in the electron transport layer (ETL). However, the present inventors have found that the combination of an electron auxiliary layer based on the Group IIA-containing zinc oxide nanoparticles and a semiconductor nanoparticle based light emitting layer may not provide a desired level of electroluminescence properties and desired lifetime characteristics, simultaneously. Without wishing to be bound by any theory, it is believed that metal oxide nanoparticles in the electron transport layer may have a deep trap band and such electron injection layer trap levels may negatively affect, e.g., contribute to, an increase in the amount of leak current, e.g., current leakage, and negatively affect the electroluminescent properties of the device. For example, after the formation of the electron transport layer, high-temperature heat treatment may negatively affect luminance of semiconductor nanoparticles, and removing traps may be a challenging task.

An electroluminescent device having an electron transport layer based on metal oxide nanoparticles may undergo a resin aging process. The resin aging may improve the electroluminescent properties of the device. The resin aging may be performed for a relatively long time, which may lead to an increase in processing time. Therefore, it is desirable to develop a technique for shortening (e.g., accelerating) the resin aging time.

In the electroluminescent device of an embodiment, the electron transport layer disposed on (e.g., directly on) the light emitting layer includes zinc oxide nanoparticles containing a Group IIA (i.e., Group 2) metal (e.g., a group 2 metal containing zinc oxide nanoparticles) and an acid salt of an alkali metal, the acid salt having an oxycarbonyl moiety (i.e., —COO— or —OCO—).

The Group IIA metal may include magnesium, calcium, barium, strontium, or a combination thereof. In an embodiment, the zinc oxide nanoparticles include zinc magnesium oxide. In an embodiment, the zinc oxide nanoparticles may further include zirconium (Zr), tungsten (W), lithium (Li), titanium (Ti), yttrium (Y), aluminum (Al), gallium (Ga), indium (In), tin (Sn), cobalt (Co), vanadium (V), or a combination thereof.

In an embodiment, the zinc oxide may include $Zn_{1-x}M^1_xO$ (where $M^1$ is a Group IIA metal and optionally, Zr, W, Li, Ti, Y, Al, gallium, indium, tin (Sn), cobalt (Co), vanadium (V), or a combination thereof, and $0 \leq x \leq 0.5$). In the chemical formula $Zn_{1-x}M^1_xO$, x may be greater than or equal to about 0.01, greater than or equal to about 0.03, greater than or equal to about 0.05, greater than or equal to about 0.07, greater than or equal to about 0.1, greater than or equal to about 0.13, greater than or equal to about 0.15, greater than or equal to about 0.17, greater than or equal to about 0.2, greater than or equal to about 0.23, or greater than or equal to about 0.25. In the chemical formula $Zn_{1-x}M^1_xO$, x may be less than or equal to about 0.47, less than or equal to about 0.45, less than or equal to about 0.43, less than or equal to about 0.4, less than or equal to about 0.37, less than or equal to about 0.35, or less than or equal to about 0.3. The zinc oxide may further include magnesium. $M^1$ may be magnesium. The zinc oxide may include $Zn_{1-x}Mg_xO$ (x is greater than 0 and less than or equal to about 0.5, and x is as described herein).

The zinc oxide nanoparticles may have an average size of greater than or equal to about 1 nm, greater than or equal to about 2 nm, greater than or equal to about 2.5 nm, greater than or equal to about 3 nm, or greater than or equal to about 3.5 nm and less than or equal to about 20 nm, less than or equal to about 15 nm, less than or equal to about 10 nm, less than or equal to about 9 nm, less than or equal to about 8 nm, less than or equal to about 7 nm, less than or equal to about 6 nm, less than or equal to about 5 nm, or less than or equal to about 4.5 nm.

In an embodiment, the metal oxide nanoparticles (e.g., zinc oxide nanoparticles) may be prepared by an appropriate method and is not particularly limited. For example, zinc magnesium oxide nanoparticles may be obtained, e.g., prepared, as follows: a zinc compound (e.g., an organic zinc compound such as zinc acetate dihydrate) and an additional metal compound (e.g., an organic additional metal compound such as magnesium acetate tetrahydrate) are placed in a reactor, e.g., added in a desired mole ratio to a reactor, including an organic solvent (e.g., dimethylsulfoxide) and heated to a predetermined temperature (e.g., about 40° C. to about 120° C., or about 60° C. to about 100° C.) in air, and then a solution of a precipitation accelerator (e.g., tetramethyl sulfoxide) ethanol solution of methylammonium hydroxide pentahydrate) is added dropwise to the reactor at a predetermined rate and stirred. The prepared zinc oxide nanoparticles (e.g., $Zn_xMg_{1-x}O$ nanoparticles) may be separated from the reaction solution by centrifugation. The acid salt of the alkali metal may include a compound represented by Chemical Formula 1.

ACOOM                     Chemical Formula 1 wherein A is hydrogen, a substituted or unsubstituted $C_{1-10}$ hydrocarbon group (e.g., a substituted or unsubstituted alkyl group such as a methyl group, an ethyl group, a propyl group, a butyl group, a pentyl group, a hexyl group, a substituted or unsubstituted alkenyl group, or a substituted or unsubstituted alkynyl group), or a combination thereof, and M is sodium, potassium, rubidium, cesium, or a combination thereof. The acid salt of the alkali metal may include formate, acetate, propionate, butyrate, valerate, caproate, or a combination thereof.

The acid salt of the alkali metal may include potassium formate, potassium acetate, potassium propionate, potassium butyrate, potassium valerate, potassium caprate, rubidium formate, rubidium acetate, rubidium propionate, rubidium butyrate, rubidium valerate, rubidium caprate, cesium formate, cesium acetate, cesium propionate, cesium butyrate, cesium valerate, cesium caprate, or a combination thereof. The acid salt of the alkali metal may include at least two compounds.

In an embodiment, the presence of the acid salt of the alkali metal in the electron transport layer may be confirmed by the presence of a corresponding carboxylic acid, a corresponding carboxylate, and the alkali metal or metal ions.

The present inventors have surprisingly found that such an electron transport layer may exhibit an extended life-span while maintaining a high level of luminescent properties (e.g., maximum external quantum efficiency and luminance) of an electroluminescent device. In addition, the present inventors have surprisingly found that the electron transport layer may reduce the leak current, e.g., current leakage, and shorten the resin aging treatment time.

The present inventors have found that the zinc oxide nanoparticles wet synthesized for use in an electron transport layer (ETL) exhibit an increased leak current, e.g., leakage current. Without wishing to be bound by any theory, it is believed that the wet synthesized Zn oxide-based nanoparticles may have a zinc dangling bond or a hydroxide moiety on the surface and carboxylic acid compounds (e.g., acetic acid moiety) derived from precursors during the wet synthesis and coordinating the particle surface, wherein such a dangling bond (Zn:) and a hydroxy moiety (Zn—OH) or an acetic acid moiety are thought to increase the leakage current through the electron transport layer (ETL). In the device of an embodiment, the acid salt of an alkali metal (e.g., —COOH and the alkali metal) in the electron transport layer (ETL) may provide sufficient passivation (e.g., ACOO-exchange of an acetic acid moiety, ACOO-bonding to Zn dangling bonds, or a formation of a Zn—O-M moiety by binding of alkali metal, and a hydroxide moiety removal caused thereby) onto the surface of the zinc oxide nanoparticles and thereby, substantially reduce deep traps in the electron transport layer (ETL).

In addition, the introduction of the electron transport layer according to an embodiment may contribute to an increase in an acid component (or an organic acid component) and acceleration of a subsequent resin aging process.

In an embodiment, in the electron transport layer, a mole ratio of alkali metal to zinc may be greater than or equal to about 0.08:1, greater than or equal to about 0.1:1, greater than or equal to about 0.12:1, greater than or equal to about 0.14:1, or greater than or equal to about 0.15:1, or greater than or equal to about 0.153:1. The mole ratio of alkali metal to zinc may be less than or equal to about 0.5:1, less than or equal to about 0.45:1, less than or equal to about 0.4:1, less than or equal to about 0.35:1, less than or equal to about 0.3:1, or less than or equal to about 0.25:1.

In an embodiment, in the electron transport layer, a mole ratio of carbon to the Group IIA metal (e.g., magnesium) may be greater than or equal to about 3.7:1, greater than or equal to about 3.9:1, greater than or equal to about 4:1, greater than or equal to about 4.1:1, greater than or equal to about 4.2:1, greater than or equal to about 4.3:1, greater than or equal to about 4.4:1, or greater than or equal to about 4.5:1. The mole ratio of carbon to the Group IIA metal (e.g., magnesium) may be less than or equal to about 8:1, less than or equal to about 7:1, less than or equal to about 6:1, less than or equal to about 5.5:1, less than or equal to about 5:1, less than or equal to about 4.8:1, less than or equal to about 4.7:1, or less than or equal to about 4.5:1.

In an embodiment, in the electron transport layer, a mole ratio of oxygen to the Group IIA metal may be greater than or equal to about 12.8:1, greater than or equal to about 13:1, greater than or equal to about 13.5:1, greater than or equal to about 14:1, greater than or equal to about 14.5:1, greater than or equal to about 15:1, greater than or equal to about 15.5:1, or greater than or equal to about 16:1. The mole ratio of oxygen to the Group IIA metal may be less than or equal to about 25:1, less than or equal to about 23:1, less than or equal to about 21:1, less than or equal to about 19:1, less than or equal to about 18:1, less than or equal to about 17:1, or less than or equal to about 16.5:1.

In the electron transport layer, a mole ratio of alkali metal to the Group IIA metal (e.g., magnesium) may be greater than or equal to about 0.8:1, greater than or equal to about 0.81:1, greater than or equal to about 0.82:1, greater than or equal to about 0.83:1, greater than or equal to about 0.84:1, greater than or equal to about 0.85:1, greater than or equal to about 0.86:1, greater than or equal to about 0.87:1, greater than or equal to about 0.88:1, greater than or equal to about 0.89:1, greater than or equal to about 0.9:1, greater than or equal to about 0.92:1, greater than or equal to about 0.94:1, greater than or equal to about 0.96:1, greater than or equal to about 0.98:1, or greater than or equal to about 1:1 and less than or equal to about 2:1, less than or equal to about 1.5:1, or less than or equal to about 1.2:1.

The mole ratio may be measured by any suitable means (e.g., X-ray photoelectron spectroscopy, (transmission or scanning) electron microscopy-energy dispersive spectroscopy, etc.).

A thickness of the electron transport layer may be greater than or equal to about 3 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, greater than or equal to about 20 nm, greater than or equal to about 21 nm, greater than or equal to about 22 nm, greater than or equal to about 23 nm, greater than or equal to about 24 nm, greater than or equal to about 25 nm, greater than or equal to about 26 nm, greater than or equal to about 27 nm, greater than or equal to about 28 nm, greater than or equal to about 29 nm, greater than or equal to about 30 nm, greater than or equal to about 31 nm, greater than or equal to about 32 nm, greater than or equal to about 33 nm, greater than or equal to about 34 nm, or greater than or equal to about 35 nm. The thickness of the electron transport layer may be less than or equal to about 90 nm, less than or equal to about 80 nm, less than or equal to about 70 nm, less than or equal to about 60 nm, less than or equal to about 50 nm, less than or equal to about 45 nm, less than or equal to about 40 nm, or less than or equal to about 35 nm.

In an embodiment, the electron transport layer may have a first surface facing the light emitting layer and a second surface opposite to the first surface. In the electron transport layer, an amount of an alkali metal in the portion adjacent to the first surface may be greater than that in the portion adjacent to the second surface. In an embodiment, the electron transport layer may include a first layer including the first surface and a second layer including the second surface. The first layer (or the first portion), the second layer (or the second portion), or a combination thereof may include one or more alkali metals. The first layer, the second layer, or a combination thereof may include cesium, rubidium, or a combination thereof. In an embodiment, the second layer may not include an alkali metal. In an embodiment, the amount of alkali metal in the first layer may be about 1 time or more, about 1.2 times or more, about 1.5 times or more, about 2 times or more, about 3 times or more, about 4 times or more, about 5 times or more, about 6 times or more, about 7 times or more, about 8 times or more, about 9 times or more, or about 10 times or more the amount of alkali metal in the second layer.

The amount of alkali metal in the first layer may be about 100 times or less, about 90 times or less, about 80 times or less, about 70 times or less, about 60 times or less, about 50 times or less, about 40 times or less, about 30 times or less, about 20 times or less, or about 15 times or less the amount of alkali metal in the second layer.

A thickness of the first layer may be greater than or equal to about 1 nm, greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, or greater than or equal to about 9 nm. The thickness of the first layer may be less than or equal to about 15 nm, less than or equal to about 13 nm, less than or equal to about 11 nm, less than or equal to about 10 nm, less than or equal to about 9 nm, less than or equal to about 8 nm, less than or equal to about 7 nm, less than or equal to about 6 nm, less than or equal to about 5 nm, less than or equal to about 4 nm, less than or equal to about 3 nm, or less than or equal to about 2 nm.

A thickness of the second layer may be greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, greater than or equal to about 20 nm, greater than or equal to about 25 nm, or greater than or equal to about 30 nm.

The thickness of the second layer may be less than or equal to about 50 nm, less than or equal to about 45 nm, less than or equal to about 40 nm, less than or equal to about 35 nm, less than or equal to about 30 nm, less than or equal to about 25 nm, less than or equal to about 20 nm, or less than or equal to about 15 nm.

In an embodiment, the electron auxiliary layer 14 may further include an electron injection layer, a hole blocking layer, or a combination thereof. The thickness of the electron injection layer, the hole blocking layer, or a combination thereof is not particularly limited and may be appropriately selected. A thickness of the electron injection layer, the hole blocking layer, or a combination thereof may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm, and less than or equal to about and 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto. The electron injection layer material, hole blocking layer material, or a combination thereof may be appropriately selected and is not particularly limited. In an embodiment, a material of the electron injection layer, hole blocking layer, or a combination thereof may include 1,4,5,8-naphthalene-tetracarboxylic dianhydride (NTCDA), bathocuproine (bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, ET204 (8-(4-(4,6-di(naphthalen-2-yl)-1,3,5-triazin-2-yl)phenyl)quinolone), 8-hydroxyquinolinato lithium (Liq), 2,2',2''-(1,3,5-Benzinetriyl)-tris(1-phenyl-1-H-benzimidazole) (TPBi), an n-type metal oxide (e.g., zinc oxide, $HfO_2$, etc.), 8-(4-(4,6-di(naphthalen-2-yl)-1,3,5-triazin-2-yl)phenyl)quinolone:8-hydroxyquinolinato lithium (ET204:Liq), or a combination thereof, but is not limited thereto.

The light emitting device according to an embodiment may further include a hole auxiliary layer. The hole auxiliary layer 12 is disposed between the anode 11 and the light emitting layer 13. The hole auxiliary layer 12 may include a hole injection layer, a hole transport layer, an electron (or hole) blocking layer, or a combination thereof. The hole auxiliary layer 12 may be a layer of a single component or a multilayer structure in which adjacent layers include different components.

The HOMO energy level of the hole auxiliary layer 12 may have a HOMO energy level that can be matched with the HOMO energy level of the light emitting layer 13 in order to enhance mobility of holes transferred from the hole auxiliary layer 12 to the light emitting layer 13. In an embodiment, the hole auxiliary layer 12 may include a hole injection layer close to the anode 11 and a hole transport layer close to the light emitting layer 13.

The material included in the hole auxiliary layer 12 (e.g., a hole transport layer, a hole injection layer, or an electron blocking layer) is not particularly limited, and may include, for example, poly(9,9-dioctyl-fluorene-co-N-(4)-butylphenyl)-diphenylamine) (TFB), polyarylamine, poly(N-vinylcarbazole), poly(3,4-ethylenedioxythiophene) (PEDOT), poly(3,4-ethylenedioxythiophene) polystyrene sulfonate (PEDOT:PSS), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA (4,4',4''-Tris[phenyl(m-tolyl)amino]triphenylamine), 4,4',4''-tris(N-carbazolyl)-triphenylamine (TCTA), 1,1-bis[(di-4-toylamino)phenylcyclohexane (TAPC), a p-type metal oxide (e.g., NiO, $WO_3$, $MoO_3$, etc.), a carbon-based material such as graphene oxide, or a combination thereof, but is not limited thereto.

In the hole auxiliary layer, the thickness of each layer may be appropriately selected. For example, the thickness of each layer may be greater than or equal to about 5 nm, greater than or equal to about 10 nm, greater than or equal to about 15 nm, or greater than or equal to about 20 nm and less than or equal to about 100 nm, less than or equal to about 90 nm, less than or equal to about 80 nm, less than or equal to about 70 nm, less than or equal to about 60 nm, less than or equal to about 50 nm, for example, less than or equal to about 40 nm, less than or equal to about 35 nm, or less than or equal to about 30 nm, but is not limited thereto.

A device according to an embodiment may have a normal structure. In an embodiment, in the device, the anode 10 disposed on the transparent substrate 100 may include a metal oxide-based transparent electrode (e.g., an ITO electrode), and the cathode 50 facing the anode 10 may include a conductive metal (e.g., having a relatively low work function, Mg, Al, etc.). The hole auxiliary layer 20 (e.g., a hole injection layer such as PEDOT:PSS, a p-type metal oxide, or a combination thereof; a hole transport layer such as TFB, polyvinylcarbazole (PVK), or a combination thereof; or a combination thereof) may be provided between the transparent electrode 10 and the light emitting layer 30. The hole injection layer may be disposed close to the transparent electrode and the hole transport layer may be disposed close to the light emitting layer. The electron auxiliary layer 40 such as an electron injection/transport layer may be disposed between the light emitting layer 30 and the cathode 50. (Refer to FIG. 2)

A device according to an embodiment may have an inverted structure. The second electrode 50 disposed on the transparent substrate 100 may include a metal oxide-based transparent electrode (e.g., ITO), and the anode 10 facing the cathode 50 may include a metal (e.g., having a relatively high work function, Au, Ag, etc.). For example, an (optionally doped) n-type metal oxide (crystalline Zn metal oxide) or the like may be disposed as an electron auxiliary layer 40 (e.g., an electron transport layer) between the transparent electrode 50 and the light emitting layer 30. $MoO_3$ or other p-type metal oxide may be disposed as a hole auxiliary layer 20 (e.g., a hole transport layer including TFB, PVK, a combination thereof; a hole injection layer including $MoO_3$ or other p-type metal oxide; or a combination thereof) between the metal anode 10 and the light emitting layer 30. (Refer to FIG. 3)

In an embodiment, a method of producing an electroluminescent device includes forming the light emitting layer on the first electrode; forming an electron transport layer on the light emitting layer; and forming a second electrode on the electron transport layer.

In an embodiment, the electroluminescent device may be manufactured by optionally forming a hole auxiliary layer (e.g., by deposition or coating) on a substrate on which an electrode is formed, forming a light emitting layer including semiconductor nanoparticles (e.g., a pattern of the aforementioned semiconductor nanoparticles), and forming (optionally, an electron auxiliary layer and) an electrode (e.g., by vapor deposition or coating) on the light emitting layer. A method of forming the electrode/hole auxiliary layer/electron auxiliary layer may be appropriately selected and is not particularly limited. The formation of the light emitting layer is the same as described herein.

The forming of the electron transport layer includes preparing a first mixture including the zinc oxide nanoparticles; and the acid salt of the alkali metal.

In an embodiment, the forming of the electron transport layer includes preparing a first mixture in which zinc oxide nanoparticles containing a Group IIA metal are dispersed in an organic solution including the acid salt of the alkali metal and a first organic solvent; and applying the first mixture on the light emitting layer to form a film.

The formed film may be heat-treated at a temperature of less than about 160° C., less than or equal to about 150° C. or less than or equal to about 120° C.

The forming of the electron transport layer may further include preparing a second mixture in which zinc oxide nanoparticles containing a Group IIA metal are dispersed in a second organic solvent; and applying the second mixture on the film and optionally heat-treating it. In an embodiment, the second mixture may not include the acid salt of the alkali metal. The zinc oxide nanoparticles included in the second mixture may have the same or different composition as the zinc oxide particles included in the first mixture. The zinc oxide nanoparticles included in the second mixture may include ZnO.

The method may further include washing the applied film using a washing organic solvent. The washing may include, but is not limited to, dropwise addition of solvent, spin coating, or a combination thereof.

The details of the acid salt of the alkali metal and the zinc oxide nanoparticles are the same as described herein.

In the forming of the electron transport layer, the preparing of the first mixture may include mixing a dispersion in which a plurality of metal oxide nanoparticles are dispersed in a solvent (e.g., a first organic solvent or an organic solvent miscible with the first organic solvent) with a solution obtained, e.g., prepared, by dissolving an acid salt of an alkali metal in the first solvent. In an embodiment, the preparing of the first mixture may include dissolving the acid salt of the alkali metal in the dispersion based on the first organic solvent.

The first organic solvent and the second organic solvent may be a C1 to O10 alcohol solvent or a combination thereof. The first organic solvent, the second organic solvent, or a combination thereof may include a $C_{1-10}$ alcohol (e.g., ethanol, methanol, propanol, butanol, pentanol, etc.), or a combination thereof. The first organic solvent and the second organic solvent may be the same. The first organic solvent and the second organic solvent may be different. The washing solvent may be the same as or miscible with the first organic solvent.

The first mixture may be applied on the light emitting layer by an appropriate method (e.g., spin coating or drop casting). The applied film may be heat-treated at a predetermined temperature, for example, less than about 160° C., less than or equal to about 150° C., or less than or equal to about 120° C., in order to remove, for example, an organic solvent. The heat treatment may be performed, for example, in an inert gas such as nitrogen or argon, in an atmosphere or in an atmosphere. The heat-treatment temperature may be less than about 120° C., less than or equal to about 115° C., less than or equal to about 110° C., less than or equal to about 105° C., less than or equal to about 100° C., less than or equal to about 95° C., less than or equal to about 90° C., or less than or equal to about 85° C. The heat-treatment temperature may be greater than or equal to about 40° C., greater than or equal to about 50° C., greater than or equal to about 60° C., greater than or equal to about 65° C., greater than or equal to about 70° C., or greater than or equal to about 75° C.

In the first mixture, an amount of the acid salt of the alkali metal relative to the zinc oxide may be appropriately selected taking into consideration the desired amount of the alkali metal, for example, in the final nanoparticles and the solubility of the acid salt. In an embodiment, the amount of the acid salt of the alkali metal relative to 100 parts by weight of zinc oxide may be greater than or equal to about 0.5 parts by weight, greater than or equal to about 1 part by weight, greater than or equal to about 5 parts by weight, or greater than or equal to about 10 parts by weight. In an embodiment, the amount of the acid salt of an alkali metal relative to 100 parts by weight of zinc oxide may be less than or equal to about 20 parts by weight, less than or equal to about 15 parts by weight, or less than or equal to about 8 parts by weight.

The concentration of the acid salt of the alkali metal in the first mixture may be appropriately selected taking into consideration a desired amount alkali metal and solubility of the acid salt in the final nanoparticles. In an embodiment, the concentration of the acid salt of the alkali metal may be a range of about 0.5 to about 15 weight ratio (wt %), about 1 to about 12 wt %, about 2 to about 10 wt %, about 3 to about 9 wt %, about 4 to about 8 wt %, or a combination thereof, relative to the weight of the zinc metal oxide particles (e.g., a weight of a zinc magnesium oxide nanoparticle).

After forming the second electrode (for example, after applying the polymerizable resin on the second electrode), the method may further include resin aging in which the second electrode is left, e.g., maintained, at a temperature of about 100° C. or less, about 40 to about 90° C., about 50 to about 80° C., or about 60 to about 70° C. The resin aging time may be appropriately adjusted, and may be about 10 hours or more, about 20 hours or more, about 24 hours or more, about 48 hours or more, about 72 hours or more, about 96 hours or more, or about 100 hours or more. The resin aging time may be less than about 7 days or less, about 6 days or less, about 5 days or less, about 4 days or less, about 3 days or less, or about 2 days or less. The electroluminescent device of an embodiment may achieve improved electroluminescent properties in resin aging for a relatively short period of time.

The polymerizable resin may be a resin used for the encapsulation of the electroluminescent device, and the type is not particularly limited. The polymerizable resin may be an acrylic resin such as poly(meth)acrylate or poly(methacrylic acid), a urethane resin, a vinyl resin, an epoxy resin, or a combination thereof. The polymerizable resin may have a polymerizable moiety (e.g., a carbon-carbon double bond, etc.).

The electroluminescent device of an embodiment may exhibit an improved level of electroluminescent properties. The resin aging for the electroluminescent device of an embodiment may be performed within a relatively short time.

The electroluminescent device of an embodiment may exhibit a maximum external quantum efficiency (EQE) of greater than or equal to about 5%, greater than or equal to about 5.5%, greater than or equal to about 6%, greater than or equal to about 6.5%, greater than or equal to about 7%, greater than or equal to about 7.5%, greater than or equal to about 7.7%, greater than or equal to about 8%, greater than or equal to about 8.5%, greater than or equal to about 9%, greater than or equal to about 9.5%, greater than or equal to about 10%, greater than or equal to about 10.5%, greater than or equal to about 11%, greater than or equal to about 11.5%, greater than or equal to about 12%, greater than or equal to about 12.5%, greater than or equal to about 13%, greater than or equal to about 13.5%, or greater than or equal to about 14%. The blue light emitting layer may exhibit the maximum external quantum efficiency (EQE) of less than or equal to about 100%, less than or equal to about 90%, less than or equal to about 80%, less than or equal to about 70%, less than or equal to about 60%, less than or equal to about 50%, less than or equal to about 40%, less than or equal to about 30%, or less than or equal to about 20%.

The electroluminescent device may exhibit maximum luminance of greater than or equal to about 60,000 candelas per square meter ($cd/m^2$), greater than or equal to about 75,000 $cd/m^2$, greater than or equal to about 100,000 $cd/m^2$, greater than or equal to about 150,000 $cd/m^2$, greater than or equal to about 200,000 $cd/m^2$, greater than or equal to about 250,000 $cd/m^2$, or greater than or equal to about 300,000 $cd/m^2$. The electroluminescent device may exhibit a maximum luminance of less than or equal to about 5,000,000 $cd/m^2$, less than or equal to about 1,000,000 $cd/m^2$, less than or equal to about 900,000 $cd/m^2$, or less than or equal to about 500,000 $cd/m^2$.

The electroluminescent device of one embodiment may exhibit, for example, when being driven at a predetermined luminance (e.g., about 650 nit ($cd/m^2$)), T50 of greater than or equal to about 20 hours, for example, greater than or equal to about 25 hours, greater than or equal to about 30 hours, greater than or equal to about 40 hours, greater than or equal to about 50 hours, greater than or equal to about 60 hours, greater than or equal to about 65 hours, or greater than or equal to about 70 hours. The T50 may range from about 25 hours to about 1,000 hours, about 26 hours to about 500 hours, about 26.5 hours to about 300 hours, or a combination thereof.

The electroluminescent device may exhibit, for example, when being driven at a predetermined luminance (e.g., about 650 nit), T90 of greater than or equal to about 5 hours, greater than or equal to about 6 hours, greater than or equal to about 7 hours, greater than or equal to about 7.5 hours, greater than or equal to about 8 hours, greater than or equal to about 9 hours, greater than or equal to about 10 hours, greater than or equal to about 20 hours, greater than or equal to about 30 hours, greater than or equal to about 40 hours, greater than or equal to about 50 hours, greater than or equal to about 60 hours, greater than or equal to about 70 hours, greater than or equal to about 80 hours, or greater than or equal to about 90 hours. The electroluminescent device may exhibit a T90 of about 7 hours to about 1,000 hours, about 8 hours to about 800 hours, or a combination thereof (when driven at a predetermined luminance, for example, 650 nit).

An embodiment relates to a display device including the aforementioned electroluminescent device.

The display device may include a first pixel and a second pixel configured to emit light of a color differing from that of the first pixel. In the first pixel, the second pixel, or a combination thereof, the electroluminescent device according to an embodiment may be disposed. In an embodiment, the display device may further include a blue pixel, a red pixel, a green pixel, or a combination thereof. In the display device, the red pixel may include a red light emitting layer including a plurality of red light emitting semiconductor nanoparticles, the green pixel may include a green light emitting layer including a plurality of green light emitting semiconductor nanoparticles, and the blue pixel may include a blue light emitting layer including a plurality of blue light emitting semiconductor nanoparticles.

The display device may include a portable terminal device, a monitor, a laptop, a television, an electric sign board, a camera, or an electronic component.

Hereinafter, specific examples are illustrated. However, these examples are exemplary, and the present disclosure is not limited thereto.

EXAMPLES

Analysis Methods
1. Electroluminescence Spectroscopic Analysis
A current according to a voltage is measured with a Keithley 2635B source meter, while the voltage is applied, and a CS2000 spectrometer is used to measure electroluminescence (EL) light-emitting luminance.
2. Life-Span Characteristic
(1) T90: when driving with predetermined luminance (e.g., 650 nit (candelas per square meter)), a time (hours (hr)) for the luminance to reach 90% of the initial luminance.
(2) Relative life span is calculated based on the measured T90.
3. Transmission Electron Microscopy (TEM) Analysis
A transmission electron microscopy analysis of the prepared nanoparticles is performed by using an UT F30 Tecnai electron microscope.
4. Photoluminescence Analysis
Photoluminescence (PL) analysis is performed by using a Hitachi F-7000 spectrophotometer.

The following synthesis is performed under an inert gas atmosphere (under a nitrogen flowing condition), unless otherwise specified. A precursor amount is a molar amount, unless otherwise specified.

Synthesis Example 1

Selenium (Se) and tellurium (Te) are dispersed in trioctylphosphine (TOP) to prepare a Se/TOP stock solution and a Te/TOP stock solution, respectively. To a reactor containing trioctylamine, 0.125 millimoles (mmol) of zinc acetate with oleic acid are added, and then the mixture is heated to 120° C. under vacuum. After 1 hour, an atmosphere in the reactor is converted to nitrogen.

After heating the reactor to 300° C., the prepared Se/TOP stock solution and Te/TOP stock solution in a Te:Se ratio of 1:20 are rapidly injected thereinto. When a reaction is completed, after rapidly cooling the reaction solution to room temperature, acetone is added thereto and then, centrifuged, and precipitates therefrom are dispersed in toluene, obtaining a ZnSeTe core particle.

To a flask containing trioctylamine, 1.8 mmol of zinc acetate with oleic acid are added, and then the mixture is vacuum-treated, e.g., subjected to vacuum conditions, at 120° C. for 10 minutes. The atmosphere of the flask is internally substituted with nitrogen ($N_2$) and heated to 180° C. Subsequently, the prepared ZnTeSe core particle is added thereto, and Se/TOP and S/TOP are injected thereinto. The reaction temperature is set at about 280° C. When the reaction is completed, the reactor is cooled, and nanocrystals are centrifuged with ethanol and dispersed in toluene, to prepare blue light-emitting semiconductor nanoparticles.

Through a photoluminescence analysis, the semiconductor nanoparticles turn out to have a maximum light emitting peak wavelength of 455 nanometers (nm).

The synthesized semiconductor nanoparticles (optical density: 0.25 at 420 nm, 6 milliliters (mL)) are precipitated in ethanol and then, centrifuged and redispersed in cyclohexane, to prepare a cyclohexane dispersion. An amount of 0.022 millimoles (mmol) of zinc chloride dissolved in ethanol is added to the cyclohexane dispersion and then, stirred at 80° C. for 30 minutes. The treated semiconductor nanoparticles are recovered through centrifugation and dispersed in octane, to prepare an octane dispersion.

Synthesis Example 2: Synthesis of ZnMgO Nanoparticles

Zinc acetate dihydrate and magnesium acetate tetrahydrate are added to a reactor containing dimethyl sulfoxide and heated to 60° C. in air. Subsequently, an ethanol solution of tetramethylammonium hydroxide pentahydrate is added to the reactor. After 1 hour of stirring, precipitates formed therein are centrifuged and dispersed in ethanol, obtaining $Zn_{1-x}Mg_xO$ nanoparticles. (x=0.15)

A transmission electron microscope analysis of the nanoparticles is performed. As a result, the particles have an average size of about 3 nm.

Example 1

An electroluminescent device with a structure of indium tin oxide (ITO)/poly(3,4-ethylenedioxythiophene) polystyrene sulfonate (PEDOT:PSS) (30 nm)/poly(9,9-dioctyl-fluorene-co-N-(4)-butylphenyl)-diphenylamine) (TFB) (25 nm)/ quantum dot (QD) light emitting layer (32 nm)/electron transport layer (ETL) (20 nm)/Al (100 nm) is manufactured according to the following method:

An alkali metal acid salt solution is prepared by dissolving rubidium formate (the acid salt of the alkali metal, Cas No. 3495-35-0, Sigma-Aldrich Co., Ltd.) in ethanol. The zinc magnesium oxide nanoparticles according to Synthesis Example 2 are dispersed in ethanol to prepare a dispersion, which is mixed with the alkali metal acid solution, preparing a mixture. In the mixture, based on 100 parts by weight of the zinc magnesium oxide nanoparticles, an amount of the alkali metal acid salt is 9 weight percent (wt %).

After surface-treating a glass substrate deposited with ITO with ultraviolet (UV)-ozone for 15 minutes, a PEDOT:PSS solution (H.C. Starks, Inc.) is spin-coated thereon and heat-treated at 150° C. for 10 minutes under an air atmosphere and then, at 150° C. for 20 to 30 minutes under an $N_2$ atmosphere to form a 30 nm-thick hole injection layer.

On the hole injection layer (HIL), a poly[(9,9-dioctylfluorenyl-2,7-diyl-co (4,4'-(N-4-butylphenyl)diphenylamine] solution (TFB) (Sumitomo Corp.) is spin-coated and heat-treated at 180° C. for 30 minutes, forming a 25 nm-thick hole transport layer (HTL).

On the hole transport layer (HTL), the octane dispersion of Synthesis Example 1 is spin-coated to form a 32 nm-thick light emitting layer.

On the light emitting layer, dispersion for ETL is spin-coated and heat-treated at 80° C., forming an electron transport layer (thickness: 20 nm).

On the prepared electron transport layer, aluminum (Al) is vacuum-deposited, e.g., deposited under vacuum, to be 100 nm thick, e.g., deposited to a thickness of 100 nm, forming a cathode and manufacturing a light emitting device.

The manufactured light emitting device is measured with respect to electroluminescent properties, and the results are shown in Table 1.

Comparative Example 1

A device is manufactured in the same manner as in Example 1 except that an electron transport layer (ETL) is formed of a dispersion prepared by dispersing the zinc magnesium oxide nanoparticles of Synthesis Example 2 in ethanol without using the alkali metal acid salt solution.

The light emitting device is measured with respect to electroluminescent properties, and the results are shown in Table 1.

Comparative Example 2

A light emitting device is manufactured in the same manner as in Example 1 except that an electron transport layer (ETL) is formed by using a rubidium carbonate solution instead of the alkali metal acid salt solution.

The light emitting device is measured with respect to electroluminescent properties, and the results are shown in Table 1.

Comparative Example 3

A light emitting device is manufactured in the same manner as in Example 1 except that an electron transport layer (ETL) is formed by using cesium bicarbonate instead of the alkali metal acid salt solution.

The light emitting device is measured with respect to electroluminescent properties, and the results are shown in Table 1.

TABLE 1

|  | Maximum EQE (%) | Maximum Luminance (nit) |
| --- | --- | --- |
| Example 1 | 13% | about 77,000 |
| Comparative Example 1 | 3% | about 34,000 |
| Comparative Example 2 | 12% | about 73,000 |
| Comparative Example 3 | 13% | about 72,000 |

Referring to the results of Table 1, the electroluminescent device of Example 1 exhibits significantly improved EQE and luminance, compared with the device of Comparative Example 1. The electroluminescent device of Example 1 exhibits improved luminance, compared with the devices of Comparative Examples 2 and 3.

Experimental Example 1

The devices of Example 1 and Comparative Examples 2 and 3 are evaluated with respect to life-span characteristics, and the results are shown in Table 2.

TABLE 2

|  | Relative life-span value |
| --- | --- |
| Example 1 | 119% |
| Comparative Example 2 | 97% |
| Comparative Example 3 | 100% |

In Table 2, a relative life span value of Example 1 is a percentage of T90 of the device of Example 1 relative to T90 of the device of Comparative Example 3, and a relative life span value of Comparative Example 2 is a percentage of T90 of the device of Comparative Example 2 relative to T90 of the device of Comparative Example 3.

Referring to the results, the light emitting device of Example 1 exhibits 22% and 19% improved life-span, respectively, compared with the devices of Comparative Examples 1 and 2.

Experimental Example 2: Electron-Only Device (EOD) Evaluation

EODs were manufactured in the same manner as in Example 1 and Comparative Examples 1, 2, and 3 except that a ZnMgO electron transport layer (ETL) is formed with a dispersion prepared by dispersing the zinc magnesium oxide nanoparticles of Synthesis Example 2 instead of the hole transport layer (HTL) and the hole injection layer (HIL) PEDOT:PSS (30 nm)/TFB (25 nm), and the light emitting layer is formed to have a thickness of 28 nm.

The EODs are measured with respect to current density by repeating a sweep process of applying a voltage within a range of 0 to 8 volts (V) increasingly (forward scan) or decreasingly (backward scan) between ITO electrode and Al electrode three times, and the results are shown in Table 3.

TABLE 3

|  | Comparative Example 1 | Comparative Example 2 | Comparative Example 3 | Example 1 |
| --- | --- | --- | --- | --- |
| Current density at 8 volts for 3 sweeps (milliamperes per square centimeter (mA/cm²)) | 3.4 | 9 | 12 | 13 |

Referring to the results of Table 3, the electron transport layer (ETL) of Example 1 exhibits improved electrical conductivity properties, compared with the comparative exam pies.

Experimental Example 3: Evaluation of Resin Aging

A resin aging experiment was performed with respect to the devices of Example 1 and Comparative Examples 1 and 2 in the following method: a resin (e.g., acrylic resin) is coated on a cathode of each device and then, covered with an encapsulation cover glass. Performance (EQE, luminance) of the devices is measured with a density-voltage-luminance (J-V-L)-measuring equipment. While the device performance is evaluated by a unit of one day with the devices allowed stand in a 75° C. convection oven, the devices are examined with respect to EQE and luminance changes.

As a result, the device of Example 1 exhibits a resin-aging effect (i.e., improvement of electroluminescent properties), compared with the devices of Comparative Examples 1 and 2.

Experimental Example 4

X-ray photoelectron spectroscopy (XPS) is performed on the electron transport layer (ETL) of Example 1 and comparative Example 2, and the results are shown in Table 4:

TABLE 4

|  | XPS mole ratio | | | | | |
| --- | --- | --- | --- | --- | --- | --- |
|  | C:Mg | O:Mg | Rb:Zn | C:(Mg + Zn) | Mg:Zn | Rb:Mg |
| Example 1 Rubidium Formate (FA-Rb):ZnMgO (ZMO) | 4.697:1 | 16.508:1 | 0.1538:1 | 0.61:1 | 0.15:1 | 1.03:1 |
| Comp. Ex. 2 Rb$_2$CO$_3$:ZMO | 3.62:1 | 12.72:1 | 0.152:1 | 0.58:1 | 0.19:1 | 0.80:1 |

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. An electroluminescent device, comprising:
   an anode;
   a cathode;
   a light emitting layer disposed between the anode and the cathode; and
   an electron transport layer disposed between the light emitting layer and the cathode,
   wherein the light emitting layer comprises a plurality of semiconductor nanoparticles,
   wherein the electron transport layer comprises zinc oxide nanoparticles comprising a Group IIA metal; and an acid salt of an alkali metal that has an oxycarbonyl moiety, and
   wherein the zinc oxide nanoparticles have an average size of less than or equal to about 20 nanometers.

2. The electroluminescent device of claim 1, wherein the electroluminescent device is configured to emit blue light, green light, or red light.

3. The electroluminescent device of claim 1, wherein the plurality of semiconductor nanoparticles do not comprise cadmium, lead, mercury, or a combination thereof.

4. The electroluminescent device of claim 1, wherein the alkali metal comprises potassium, rubidium, cesium, or a combination thereof, and
   the Group IIA metal comprises magnesium,
   optionally wherein the zinc oxide nanoparticles further comprise Zr, W, Li, Ti, Y, Al, gallium, indium, tin (Sn), cobalt (Co), vanadium (V), or a combination thereof.

5. The electroluminescent device of claim 1, wherein the average size of the zinc oxide nanoparticles is greater than or equal to about 1 nanometers and less than or equal to about 8 nanometers.

6. The electroluminescent device of claim 1, wherein
   in the electron transport layer,
   a mole ratio of carbon to the Group IIA metal is greater than or equal to about 4.1:1 and less than or equal to about 8:1, and
   a mole ratio of oxygen to the Group IIA metal is greater than or equal to about 13:1 and less than or equal to about 25:1.

7. The electroluminescent device of claim 1,
   wherein in the electron transport layer, a mole ratio of alkali metal to zinc is greater than or equal to about 0.08:1 and less than or equal to about 0.5:1, or
   wherein in the electron transport layer, a mole ratio of alkali metal to the Group IIA metal is greater than or equal to about 0.8:1 and less than or equal to about 2:1.

8. The electroluminescent device of claim 1, wherein
   the carboxylic acid salt of the alkali metal is represented by ACOOM$^1$, wherein A is hydrogen, a substituted or unsubstituted C$_{1-10}$ hydrocarbon group, or a combination thereof, and M$^1$ is sodium, potassium, rubidium, cesium, or a combination thereof.

9. The electroluminescent device of claim 1, wherein
   the acid salt of the alkali metal comprises a formate, an acetate, a propionate, a butyrate, a valerate, a caproate, or a combination thereof.

10. The electroluminescent device of claim 1, wherein
    the electron transport layer has a first surface facing the light emitting layer and a second surface opposite the first surface, and
    an amount of the alkali metal in a portion adjacent to the first surface of the electron transport layer is greater than an amount of the alkali metal in a portion adjacent to the second surface of the electron transport layer.

11. The electroluminescent device of claim 1, wherein
    the electron transport layer comprises a first layer and a second layer disposed on the first layer,
    wherein the first layer faces the light emitting layer, and
    an amount of the acid salt of the alkali metal in the first layer is greater than an amount of the acid salt of alkali metal in the second layer.

12. The electroluminescent device of claim 11,
    Wherein the second layer does not comprise alkali metal, or
    wherein an amount of the alkali metal in the first layer is about 1.5 times or greater and about 100 times or less than an amount of the alkali metal in the second layer.

13. The electroluminescent device of claim 1, wherein
    the electron transport layer has a thickness of greater than or equal to about 5 nanometers and less than about 60 nanometers.

14. The electroluminescent device of claim 1, wherein the electroluminescent device exhibits a maximum external quantum efficiency of greater than or equal to about 13% and optionally a maximum luminance of greater than or equal to about 72000 nit.

15. A method of producing the electroluminescent device of claim 1, comprising:
    forming the light emitting layer on the first electrode;
    forming an electron transport layer on the light emitting layer; and
    forming a second electrode on the electron transport layer,
    wherein the forming of the electron transport layer comprises,
    dispersing the zinc oxide nanoparticles, and the acid salt of the alkali metal in a first organic solvent to prepare a first mixture;

applying the first mixture on the light emitting layer to form a film; and optionally thermally treating the film to a temperature of less than or equal to about 160° C.

16. The method of claim 15, wherein
the acid salt of the alkali metal comprises a formate, an acetate, a propionate, a butyrate, valerate, a caproate, or a combination thereof.

17. The method of claim 15, wherein
the forming of the electron transport layer further comprises:

preparing a second mixture by dispersing zinc oxide nanoparticles comprising the Group IIA metal in a second organic solvent; and applying the second mixture on the film and optionally conducting an additional heat-treatment on it.

18. The method of claim 15, wherein
after forming the second electrode, the method further comprises maintaining the device at a temperature of about 60° C. to about 100° C.

19. A display device comprising the electroluminescent device of claim 1.

20. The display device of claim 19, wherein
the display device comprises a portable terminal device, a monitor, a notebook computer, a television, an electric sign board, a camera, or an electronic component.

* * * * *